United States Patent [19]
Dobkin

[11] 4,371,792
[45] Feb. 1, 1983

[54] HIGH GAIN COMPOSITE TRANSISTOR

[75] Inventor: Robert C. Dobkin, Hillsborough, Calif.

[73] Assignee: National Semiconductor Corporation, Santa Clara, Calif.

[21] Appl. No.: 171,778

[22] Filed: Jul. 24, 1980

[51] Int. Cl.³ .................... H03K 17/60; H03K 3/26; H01L 27/02
[52] U.S. Cl. .................... 307/255; 307/299 B; 307/315; 307/313; 357/44; 357/46; 330/257
[58] Field of Search .......... 307/315, 313, 255, 299 B; 357/46, 44; 330/257

[56] References Cited
U.S. PATENT DOCUMENTS

| | | | |
|---|---|---|---|
| 4,122,401 | 10/1978 | Sauer | 330/257 |
| 4,207,478 | 6/1980 | Yamamoto et al. | 307/315 |
| 4,260,906 | 4/1981 | Tokumaru et al. | 357/46 |
| 4,277,696 | 7/1981 | Tokunaga et al. | 307/315 |

*Primary Examiner*—Stanley D. Miller
*Assistant Examiner*—B. P. Davis
*Attorney, Agent, or Firm*—Gail W. Woodward; Paul J. Winters; Neil B. Schulte

[57] ABSTRACT

A composite transistor suitable for use in monolithic integrated circuits is characterized as having extremely high current gain, stable operation and low leakage current. Two vertical NPN transistors are coupled into a circuit configuration, along with two lateral PNP transistors, that has three terminals. These terminals behave as a single NPN transistor having characteristics that are superior to those of a conventional NPN transistor.

11 Claims, 3 Drawing Figures

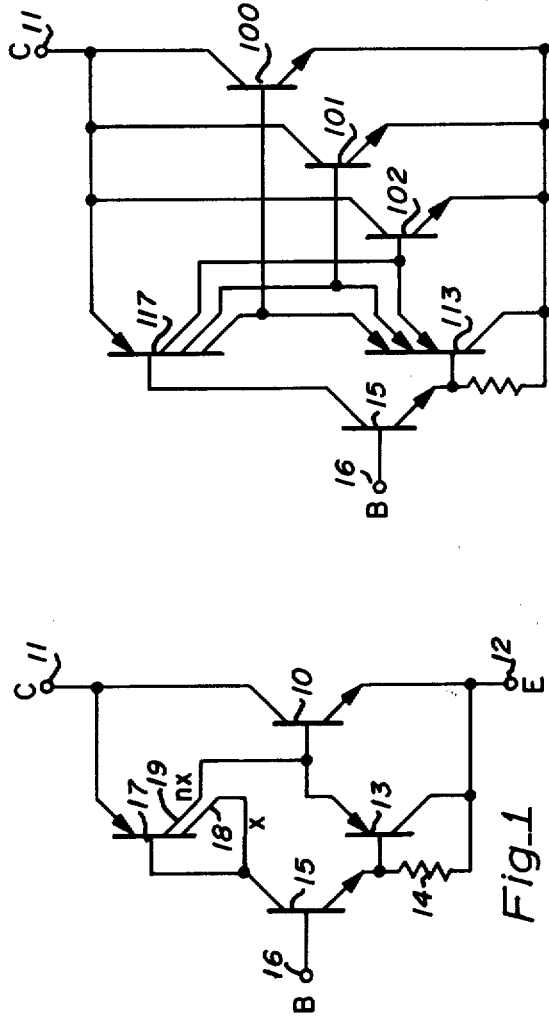
Fig_1
Fig_2
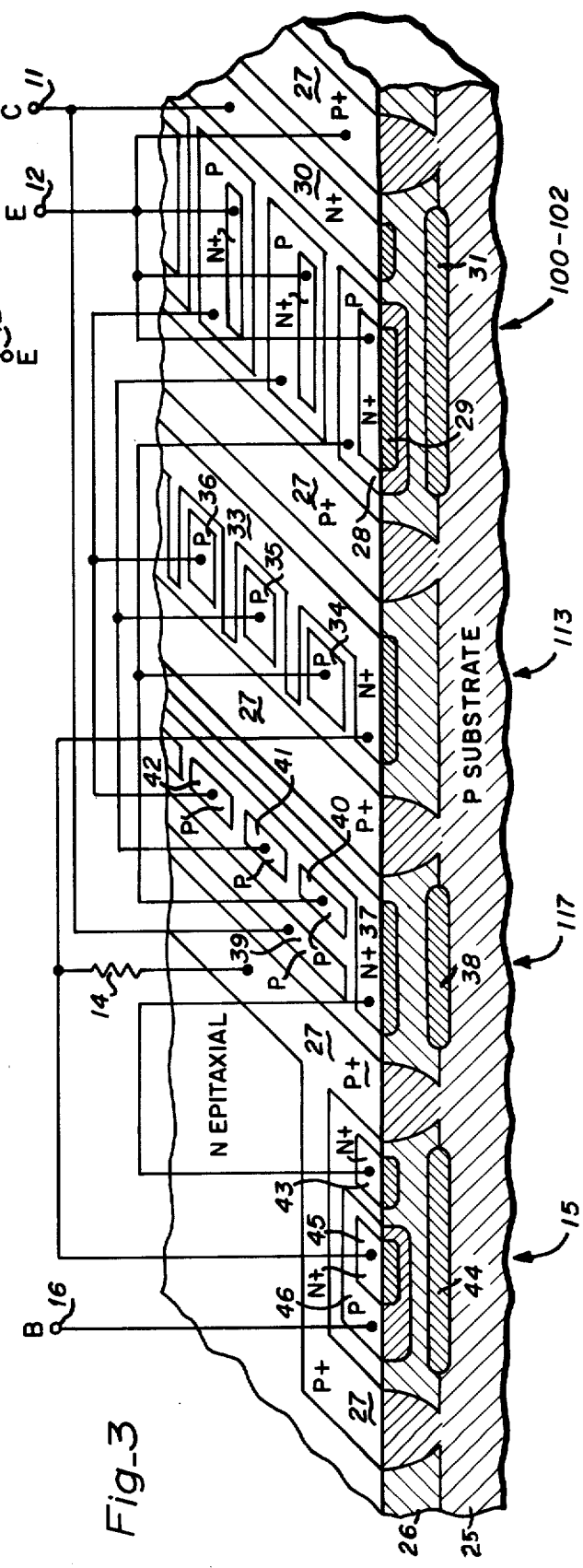
Fig_3

HIGH GAIN COMPOSITE TRANSISTOR

BACKGROUND OF THE INVENTION

In monolithic integrated circuit (IC) construction NPN transistors typically develop a base to collector current gain, or Beta, of in excess of 200 and display room temperature collector leakage current values of less than 100 picoamperes at nominal collector voltages. Such transistors are stable in that they show no tendency to oscillate in resistive circuits. While such transistors are extremely useful in the design of IC structures, there are certain types of circuits in which higher Beta would be desirable. Typically, such higher Beta is achieved using the well-known Darlington connection in which one or more emitter follower transistors are directly coupled in cascade with a common emitter transistor. A three stage Darlington has very high Beta. However, it has a composite base to emitter turn-on voltage of three diodes, about 2.1 volts and a saturation voltage over 1.5 volts under typical conditions as opposed to 0.7 volt $B_{BE}$ and a 0.5 volt saturation for a single transistor. Thus, such a composite does not really simulate a single transistor. Other circuit forms have been developed to create a suitable composite, but the usual prior art circuits, employing complementary transistors, tend to oscillate unless frequency compensated.

SUMMARY OF THE INVENTION

It is an object of the invention to provide a composite IC transistor having extremely high Beta, stable operation without frequency compensation and low collector current leakage.

It is a further object of the invention to employ an IC connected to simulate a single high performance transistor.

These and other objects are achieved in a circuit configured as follows. An NPN output stage is coupled via a PNP emitter follower to an NPN emitter following input stage. A PNP lateral transistor, acting as a current mirror, couples the collector of the input stage to the base of the output stage. The resultant three terminal circuit has the Beta of two cascaded NPN transistors multiplied by the gain of the current mirror. The circuit is internally frequency compensated as a result of the PNP emitter follower and has terminal voltages typical of a single NPN transistor. Collector leakage is controllable by the selection of geometry and resistor value.

The circuit lends itself to multiple section power output transistor construction which has a large safe operating area.

BRIEF DESCRIPTION OF THE DRAWING

FIG. 1 is a schematic diagram of the circuit of the invention;

FIG. 2 shows how the circuit of the invention is employed in a high power configuration; and FIG. 3 is a front elevation, cross-sectional view of a fragment of an IC chip having the circuit of FIG. 2.

DESCRIPTION OF THE INVENTION

FIG. 1 is a schematic diagram of the IC components that make up a composite circuit. Transistor 10 is a vertical NPN device that presents collector lead 11 and emitter lead 12 to the external connections. Transistor 10 is designed to provide the collector circuit action that is to be desired. For example, it can be a conventional small signal, lower power device. Alternatively, it can be a large area power device if desired.

Transistor 13 is of PNP is of vertical substrate collector construction connected to act as an emitter follower driver for the base of transistor 10. Resistor 14 is coupled between the collector and base of transistor 13 so as to normally turn it on. It is to be noted that the emitter current density of transistor 10 must exceed that of transistor 13 so that the $V_{BE}$ of transistor 10 exceeds that of transistor 13. This is necessary so that a positive voltage drop will appear across resistor 14. This condition will ordinarilly occur in the circuit shown because of the relationship $$V_{BE10} = V_{BE13} + V_{14}$$

where $V_{14}$ is the voltage across resistor 14 and the designated $V_{BE}$ values related to the transistor base to emitter voltages.

Transistor 15 drives the base of transistor 13 due to emitter follower action from input terminal 16. The collector of transistor 15 also drives the base of transistor 17 which is shown as a plural collector lateral device connected as a current mirror. Since the base of transistor 17 is coupled to collector lead 18 and to the collector of transistor 15, any current flowing in lead 18 will produce a related current in lead 19. For example, if the two collectors have the same degree of collection, the current minor will have unity gain. If the lead 19 collector is made ten times as effective as the lead 18 collector, the current mirror will have a gain of ten.

The composite circuit current gain will be equal to the product of the Betas of transistors 10 and 15 multipled by the current mirror gain. As a practical matter with NPN transistor Betas of 200 and a current mirror gain of 20, a composite gain or Beta from terminal 16 to terminal 11 can be 800,000 (118 db).

It will be noted that the base of the transistor 16 is very close to one diode drop above terminal 12. The actual value will be the base to emitter voltage of transistor 15 plus the voltage drop across resistor 14 which is small because it is the difference between the base to emitter drops in transistors 10 and 13.

Thus, terminal 11 acts as a collector, terminal 12 as an emitter, and terminal 16 as a base of a single, very high Beta NPN transistor. The device leakage current is very low due to the action of transistor 13. In the open base configuration very little current will flow in transistor 15 and, therefore, transistor 13 will conduct because its base is returned to its collector by resistor 14. This in turn pulls the base of transistor 10 low and turns it off. In effect, transistor 13 diverts substantially all of the current from transistor 17 away from the base of transistor 10. Thus, the leakage from terminal 11 through transistor 10 will be almost as small as if only transistor 10 were present.

In terms of high frequency gain, the circuit is self-compensated. Since the current mirror is a lateral PNP transistor and since such devices have a high frequency gain roll off, it can be seen that the current mirror gain will fall off with frequency. However, transistor 13 is also a PNP device with a gain roll off with increasing frequency. For the high frequency case where the PNP transistors are no longer operative, the emitter of transistor 15 will be diode coupled by the base-emitter diode of transistor 13 directly to the base of transistor 10. Thus, the maximum gain roll off will be to a high frequency gain equal to the Beta product of transistors 10 and 15. For the above example the gain would decrease from 800,000 to 40,000 (92 db), which is still a very high value.

Thus, the effect of the high frequency roll off is minimized by the compensation effect of the base-emitter diode of transistor 13 and the composite device is still stable and operative at frequencies above those for which the PNP devices are inoperative.

FIG. 2 is a schematic diagram of a composite transistor for higher power operation. Where the elements of the circuit have the same function as those in FIG. 1, similar numbers are used. Transistor 10 has been replaced with three separate transistors 100-12. Their emitter-collector circuits are in parallel and, if desired, their collectors can be a common isolated region in the IC. While three such transistors are shown, more could be used. While not shown, each transistor 100-103 could be constructed as an individual plural emitter power transistor, for example of the overlay form. Additionally, each of these emitters could include a series resistor to equalize current distribution to the various emitters. Such a ballasted emitter construction is well-known in the art and will not be further detailed herein.

Transistor 13 of FIG. 1 has been replaced with a plural emitter vertical PNP substrate collector device 113. A separate emitter is provided for each separate output transistor. Also, transistor 17 of FIG. 1 has been replaced with a transistor 117 having additional collectors. It will be noted that transistor 117 does not have a collector connected to its base. Thus the current mirror gain is not set by relative collector size as shown in FIG. 1. The current mirror 117 has one input coupled to transistor 15 and a plurality of equal outputs, one output for each output transistor. This circuit configuration is desired to maximize the safe operating area of the composite device. The separate drives to transistors 100-103 act as base current ballasts to equalize the current sharing. Otherwise, the circuit of FIG. 2 operates in the same manner as FIG. 1.

FIG. 3 is a front elevation cross-sectional view of an IC chip portion. The parts are arranged to show how the composite can be made up of IC components. The drawing is not to scale and is intended only to show the general relationships. The conventional planar oxide and overlying metallization have been omitted for clarity and the connections shown schematically.

The circuit chip is fabricated using a P type substrate 25 which has an N type epitaxial layer 26 thereon. A diffusion isolation 27 penetrates the epitaxial layer completely, thereby P-N junction isolating a series of N type tubs into which the various parts are created with a double diffusion process.

Transistors 101-102 are shown at the right. While three transistors are shown more could be employed. Region 28 is a P type diffused base and region 29 an N+ type diffused emitter. The emitter base configuration is repeated twice to produce a three transistor combination having a single collector region. Region 30 is the N+ type diffused collector contact which is ohmically disposd on the N type collector material. Buried N+ type layer 31 reduces the device collector resistance. These basic IC elements are used to create the other components 113, 15 and 117 as illustrated in FIG. 2 and which are interconnected as shown. It will be noted that plural collector transistor 117 will have a current mirror gain determined by the gain of the transistor segments.

Transistor 113 has a common N+ base contact 33 and is shown having three P type emitters 34-36. Substrate 25 constitutes the common collector region.

Transistor 117 has an N+ base contact 37 over buried layer 38. P diffused region 39 constitutes the lateral emitter and regions 40-42 comprise three collectors.

Transistor 15 is of conventional NPN construction. Collector contact 43 lies over buried layer 44 and regions 45 and 46 make up the emitter and base respectively.

Resistor 15 is shown schematically. It can be in a separate isolated region in the form of a conventional diffused element. Alternatively, it can be located on top of the planar oxide (not shown) in the form of a thin film structure.

EXAMPLE

The structure of the invention was fabricated using conventional IC device construction as described above. The output section comprised 30 separate transistors driven from a 30-collector lateral PNP transistor. The entire device occupied an area equal to about 60 times the area of a typical NPN transistor. The resulting composite had a low frequency gain of about 200,000 and could dissipate 30 watts when mounted on a TO-3 header. The composite could pass up to 1 ampere of collector current and could withstand up to about 40 collector volts. The collector saturation voltage was about 1 volt. The composite had no frequency compensation but displayed no instabilities.

The IC composite transistor has been described and it has been shown how the device can be assembled using conventional IC elements. When a person skilled in the art reads the foregoing description, alternatives and equivalents within the spirit and intent of the invention will be apparent. Accordingly, it is intended that the scope of the invention be limited only the claims that follow.

I claim:

1. An integrated circuit for providing a composite transistor action, said composite performing as a single three terminal transistor that displays high gain, low leakage, and stable operation over a wide frequency band, said circuit comprising:
    first, second, and third circuit terminals representing respectively the collector, emitter, and base of said composite transistor;
    a first transistor of a first conductivity having its emitter-collector circuit coupled in series between said first and said second terminals and a base;
    a second transistor of complementary conductivity having a collector returned to said second terminal, an emitter coupled to drive said base of said first transistor, and a base;
    a third transistor of said first conductivity having an emitter coupled to drive said base of said second transistor, a base connected to said third terminal and a collector; and
    a fourth transistor of said complementary conductivity having an emitter returned to said first terminal, a base coupled to be driven by said collector of said third transistor, and a collector coupled to drive said base of said first transistor.

2. The circuit of claim 1 further comprising resistor means shunting said collector and base of said second transistor.

3. The circuit of claim 1 wherein said fourth transistor has plural collectors.

4. The circuit of claim 3 wherein one of said collectors of said fourth transistor is coupled to its base.

5. The circuit of claim 4 wherein said collectors of each fourth transistor are ratioed to produce a multiple and in which the smaller collector is connected to said base whereby said fourth transistor displays current gain in proporation to said ratio.

6. The circuit of claim 1 wherein said fourth transistor has an additional collector and said second transistor has an additional emitter coupled to said additional collector and further comprising a fifth transistor of said first conductivity having a collector-emitted circuit coupled in parallel with said emitter-collector circuit of said first transistor and a base coupled to be driven by said additional collector of said fourth transistor in parallel with said additional emitter of said second transistor.

7. The circuit of claim 1 wherein said first transistor is of vertical NPN construction, said second transistor is of PNP vertical construction, said third transistor is of NPN vertical construction and said fourth transistor is of PNP lateral construction.

8. A composite transistor having emitter, base, and collector terminals comprising:
an output transistor of one conductivity and having collector and emitter electrodes to provide the composite collector and emitter terminals, and a base electrode;
an input transistor of said one conductivity and having a base electrode to provide the composite base terminal, and having collector and emitter electrodes;
an emitter follower transistor of complementary conductivity having an input coupled to be driven from said emitter of said input transistor and an output coupled to drive said base of said output transistor; and
a current mirror having an input coupled to be driven from said collector of said input transistor and an output coupled to drive said base of said output transistor.

9. The composite transistor of claim 8 further comprising a resistor element coupled between the base and collector of said emitter follower transistor.

10. The circuit of claim 9 wherein said current mirror is of lateral transistor form and has current gain.

11. The circuit of claim 10 wherein said output transistor is in plural sections each one driven by a separate emitter follower transistor and coupled to a separate output of said current mirror.

* * * * *